United States Patent
Kim et al.

(10) Patent No.: US 12,210,389 B2
(45) Date of Patent: Jan. 28, 2025

(54) METHOD FOR MANUFACTURING COVER MEMBER, AND COVER MEMBER STRUCTURE

(71) Applicant: Samsung Electronics Co., Ltd., Gyeonggi-do (KR)

(72) Inventors: Hyunsoo Kim, Gyeonggi-do (KR); Sookyu Lee, Gyeonggi-do (KR); Jaewoong Lim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 627 days.

(21) Appl. No.: 17/475,526

(22) Filed: Sep. 15, 2021

(65) Prior Publication Data
US 2022/0004231 A1 Jan. 6, 2022

Related U.S. Application Data

(63) Continuation of application No. PCT/KR2020/003357, filed on Mar. 11, 2020.

(30) Foreign Application Priority Data
Mar. 18, 2019 (KR) .......................... 10-2019-0030583

(51) Int. Cl.
*C23C 22/24* (2006.01)
*C09D 5/44* (2006.01)
(Continued)

(52) U.S. Cl.
CPC ............ *G06F 1/1656* (2013.01); *C23C 24/08* (2013.01); *C23G 5/032* (2013.01); *C25D 11/30* (2013.01);
(Continued)

(58) Field of Classification Search
CPC ......... C23C 22/24; C23C 22/73; C23C 24/08; C25D 11/026; C25D 11/30; C25D 13/20;
(Continued)

(56) References Cited

U.S. PATENT DOCUMENTS

| | | |
|---|---|---|
| 2017/0347476 A1 | 11/2017 | Hwang et al. |
| 2018/0299924 A1 | 10/2018 | Seo et al. |
| 2021/0363646 A1* | 11/2021 | Chang ................. C23C 14/0015 |

FOREIGN PATENT DOCUMENTS

| | | |
|---|---|---|
| KR | 10-2003-0040824 A | 5/2003 |
| KR | 10-2013-0068526 A | 6/2013 |

(Continued)

OTHER PUBLICATIONS

Korean Office Action dated Jan. 5, 2023.

*Primary Examiner* — Lois L Zheng
(74) *Attorney, Agent, or Firm* — Cha & Reiter, LLC

(57) ABSTRACT

A method for manufacturing a cover member for electronic devices according to certain embodiments of the present disclosure may comprise: a step for forming a magnesium plate; a step for performing primary CNC processing on the magnesium plate using a predetermined cutting oil; a step for performing a primary pretreatment on the magnesium plate using chromate or micro arc oxidation (MAO); a step for performing a primary surface-treatment on the magnesium plate by bake-coating or electrodeposition coating; a step for performing secondary CNC processing on a first region of the magnesium plate using an alcohol-containing cutting oil; a washing and drying step; a step for performing a secondary pretreatment for preventing oxidation on the first region; and a step for performing a secondary surface-treatment on the first region by bake-coating or electrodeposition coating.

12 Claims, 8 Drawing Sheets

(51) Int. Cl.
    *C23C 24/08*         (2006.01)
    *C23F 17/00*         (2006.01)
    *C23G 5/032*         (2006.01)
    *C25D 11/30*         (2006.01)
    *C25D 13/20*         (2006.01)
    *G06F 1/16*          (2006.01)
    *H05K 5/02*          (2006.01)
    *H05K 5/04*          (2006.01)

(52) U.S. Cl.
    CPC ........... *C25D 13/20* (2013.01); *H05K 5/0243* (2013.01); *H05K 5/04* (2013.01)

(58) Field of Classification Search
    CPC ..... C25D 13/22; G06F 1/1616; G06F 1/1656; G06F 1/169; G06F 3/03547; B23Q 11/10; C09D 5/44; H05K 5/0243; H05K 5/04
    See application file for complete search history.

(56) References Cited

FOREIGN PATENT DOCUMENTS

| | | |
|---|---|---|
| KR | 10-1303854 B1 | 9/2013 |
| KR | 10-2017-0070636 A | 6/2017 |
| KR | 10-1894488 B1 | 9/2018 |

\* cited by examiner

METHOD FOR MANUFACTURING COVER MEMBER, AND COVER MEMBER STRUCTURE

CROSS-REFERENCE TO RELATED APPLICATION(S)

This application is a continuation of International Application No. PCT/KR2020/003357, filed on Mar. 11, 2020, which claims priority to Korean Patent Application No. 10-2019-0030583 filed on Mar. 18, 2019 in the Korean Intellectual Property Office, the disclosures of which are herein incorporated by reference.

BACKGROUND

1. Field

Certain embodiments of the disclosure relate to a method of manufacturing an electronic device cover member and a cover member structure.

2. Description of Related Art

An electronic device refers to a device that performs a specific function according to a program equipped therein. Examples of electronic devices include, but are not limited to, an electronic scheduler, a portable multimedia player, a mobile communication terminal, a tablet PC, an image/sound device, a desktop/laptop PC, or a vehicle navigation system, as well as a home appliance. The above-mentioned electronic devices may output, for example, information stored therein as sound or an image. Electronic device are now capable of providing multiple functions, as the degree of integration of electronic devices has increased and super-high-speed and large-capacity wireless communication has become popular. For example, various functions, such as an entertainment function (e.g., a game function), a multimedia function (e.g., a music/video reproduction function), a communication and security function for mobile banking or the like, a schedule management function, and an e-wallet function, are integrated in a single electronic device, in addition to a communication function (e.g., phone and messaging).

The electronic device includes a cover member made of various materials. The cover member may be manufactured to protect internal components of the electronic device from external impact, to be compact, and aesthetically pleasing.

SUMMARY

Recently, functions and designs of various electronic devices are being manufactured to meet preferred needs of a user for user convenience or work efficiency in a smart home environment.

In general, when a cover member made of a material having a high specific gravity (e.g., aluminum (Al)) is used in a portable electronic device, the electronic device may be cumbersome to carry due to its weight. In addition, when a cover member made of a material having a low specific gravity (e.g., magnesium (Mg)) is used, it is impossible to express outward a metallic texture due to pretreatment and painting processes for preventing corrosion, and it is only possible to express a pattern of a simple shape such as a hairline or sandblast.

According to certain embodiments disclosed herein, by manufacturing a cover member of an electronic device by using magnesium (Mg), it is possible reduce the weight of an electronic device.

According to certain embodiments of the disclosure, it is possible to provide a cover member of an electronic device provided with various patterns and colors through improved processing such as a pretreatment process and a surface treatment process.

However, problems to be solved in this disclosure are not limited to those described above, and may be variously expanded without departing from the spirit and scope of this disclosure.

A method of manufacturing a cover member of an electronic device according to certain embodiments of the disclosure may include: a process of shaping a plate comprising magnesium, a process of performing primary Computer Numerical Control (CNC) machining on the magnesium plate using a predetermined cutting oil, a process of performing a primary pretreatment on the magnesium plate using chromate or micro arc oxidation (MAO), a process of performing a primary surface treatment by high temperature baking paint or electrodeposition painting on the magnesium plate, a process of performing secondary CNC machining on one region of the magnesium plate using a cutting oil containing alcohol, a process of washing and drying the magnesium plate, a process of performing a secondary pretreatment to prevent oxidation in the one region, and a process of performing a secondary surface treatment by high temperature baking paint or electrodeposition painting in the one region.

A method of manufacturing a cover member of an electronic device according to certain embodiments of the disclosure may include: a process of shaping a plate made of magnesium, a process of performing primary CNC machining on the magnesium plate using a cutting oil containing alcohol, a process of washing and drying, a process of performing a primary pretreatment on the magnesium plate to prevent oxidation, and a process of performing a primary surface treatment by high temperature baking paint or electrodeposition painting on the magnesium plate.

A cover member of an electronic device according to certain embodiments of the disclosure may include: a plate comprising magnesium, a zirconium-based coating layer formed on at least one region of the plate, and a painted layer disposed on one surface of the coating layer and formed by anionic electrodeposition painting using a material including an acrylic resin and an organic pigment According to certain embodiments disclosed herein, it is possible to provide a light-weight electronic device by manufacturing a cover member using a material including magnesium (Mg).

According to certain embodiments of the disclosure, it is possible to provide a cover that is aesthetically pleasing and provides a metallic texture for a magnesium plate through an improved pre-treatment process and a surface treatment process. In addition, it is possible to provide a cover member of an electronic device that has various patterns and colors through an improved process.

Other advantages will become evident in the disclosure with reference to the accompanying drawings.

DETAILED DESCRIPTION

Figure 1:
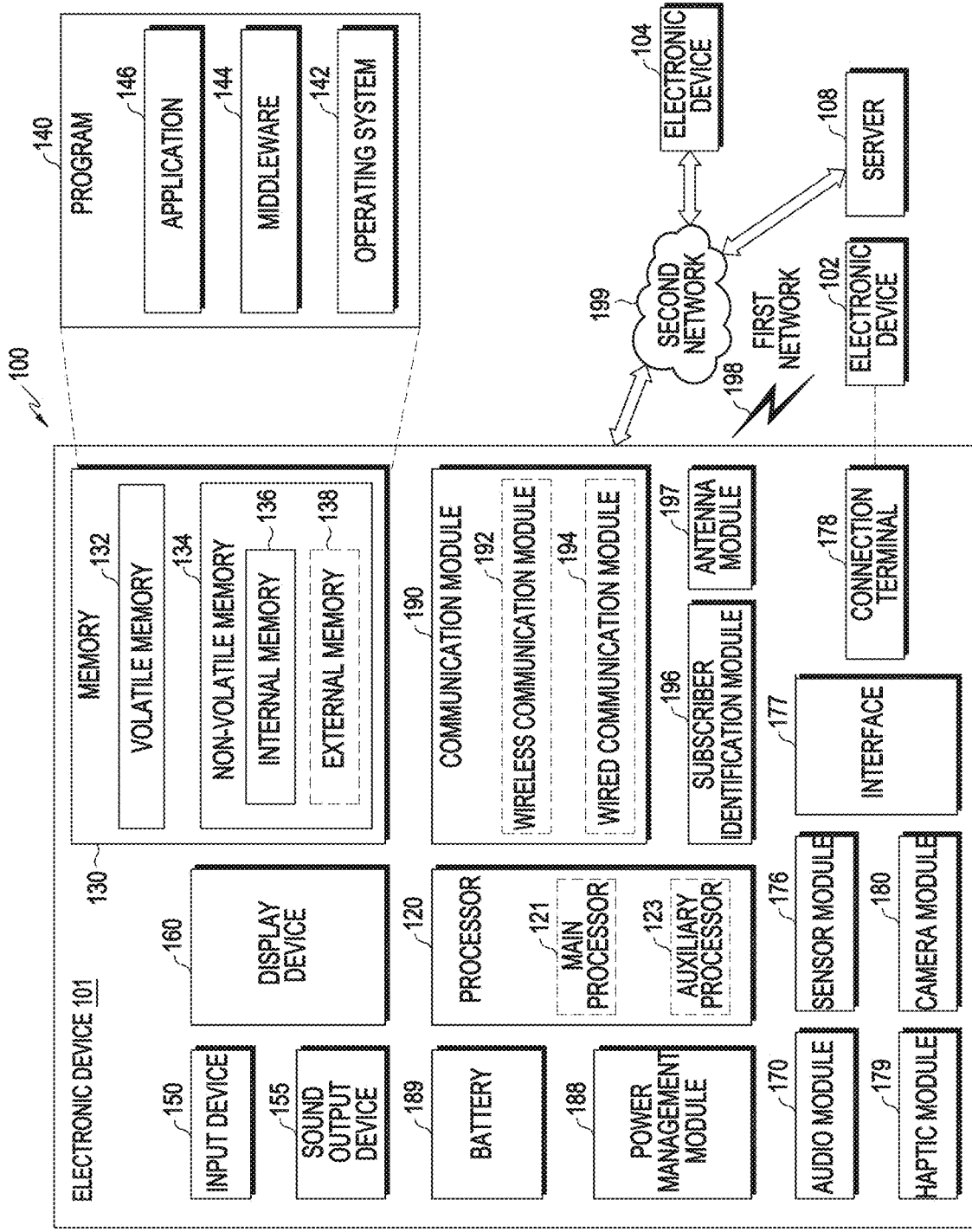
FIG. 1 is a block diagram of an electronic device according to certain embodiments of the disclosure in a network environment.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2:
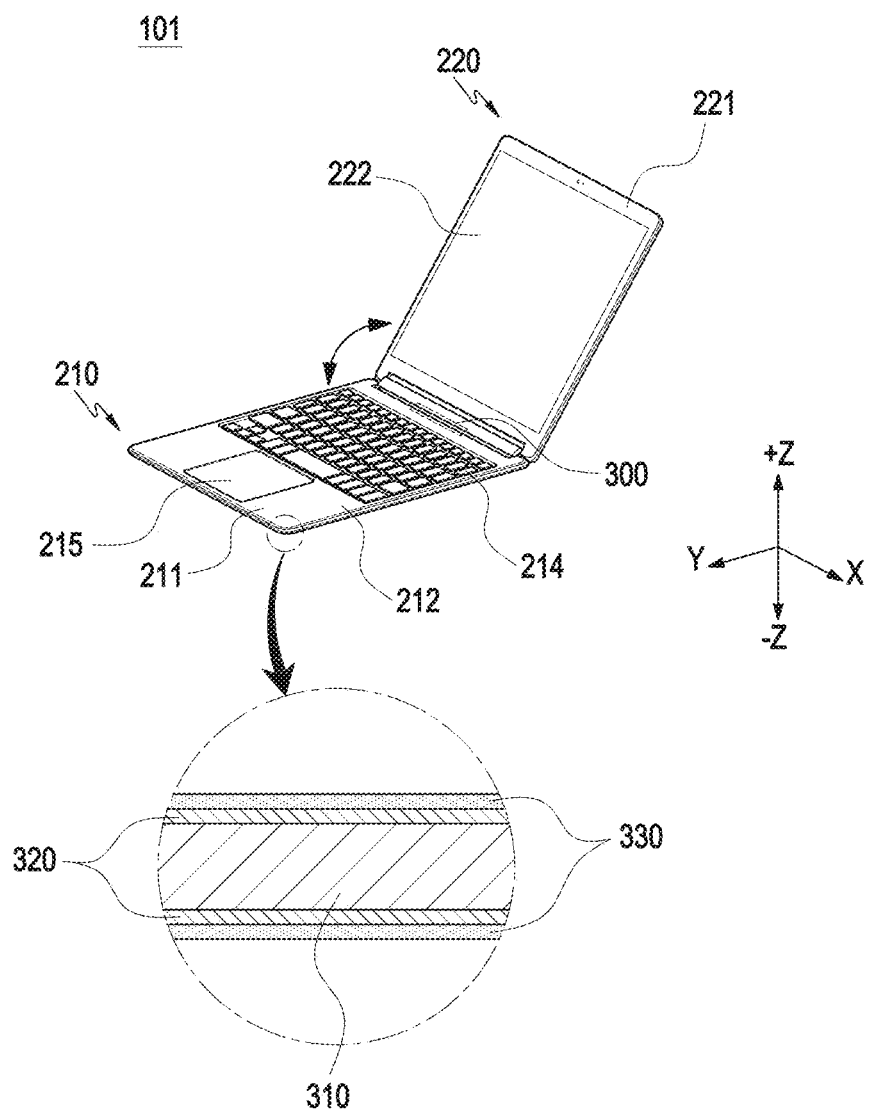
FIG. 2 is a perspective view of a portable electronic device including a cover member, according to certain embodiments of the disclosure.

FIG. 2 is a perspective view of a portable electronic device 101 including a cover member, according to certain embodiments of the disclosure.

In FIG. 2, the "X axis" in the orthogonal coordinate system of three axes may correspond to the longitudinal direction of the electronic device 101, the "Y axis" may correspond to the width direction of the electronic device 101, the "Z axis" may correspond to the thickness direction of the electronic device 101. In an embodiment of the disclosure, "Z" may indicate a first direction (+Z) or a second direction (−Z).

As illustrated in FIG. 2, the electronic device 101 may include a main body 210 and a display unit 220 electrically connectable to the main body 210 via a connector module 300 disposed in the main body 210. The connector module 300 has a structure including some components that are rotatable and length-adjustable in response to the rotation of the display unit 220 relative to the main body 210, and may be mounted and disposed in a partial region of the main body 210.

According to certain embodiments, the main body 210 may include a data input unit 214. For example, the data input unit may be a keypad device that assists an input operation such as typing to transmit data into the main body 210. The main body 210 may include a first housing 211 and a plurality of input keys on a portion of the top surface 212 of the first housing 211 that is oriented in the first (+Z) direction and may further include a touch pad 215 that is capable of replacing the function of a mouse. A user may perform a data input operation displayed or stored on the display unit 220 more quickly and conveniently using the data input unit 214.

The first housing 211 can be configured to accommodate various electronic components and the like. At least a portion of the first housing 211 may be made of a conductive material. For example, the first housing 211 may include side walls forming the outer surface of the main body 210, and the portion exposed to the exterior of the main body 210 may be made of a conductive metal material. A printed circuit and/or a battery may be accommodated in the first housing 211. For example, on the printed circuit, a processor (e.g., the processor 120 in FIG. 1), a communication module (e.g., the communication module 190 in FIG. 1), various interfaces (e.g., the interface 177 in FIG. 1), a power management module (e.g., the power management module 188 in FIG. 1), or the like may be mounted in the form of an integrated circuit chip. As another example, a control circuit (not illustrated) may also be configured as an integrated circuit chip and may be mounted on the printed circuit. For example, the control circuit may be a part of the above-described processor or communication module. Power may be secured by accommodating the battery inside the first housing 211.

The display unit 220 may be a device configured as an image display unit or a portable device in which a computing system and an image display unit are integrated into a single device. The display unit 220 may include therein a data input unit, a data output unit, and/or a data input/output unit. For example, as the data input unit, an input device, such as a keypad, may be employed, as the data output unit 130, a display unit, such as a display device, may be employed, and as the data input/output unit, a device, such as a touch screen, may be employed.

According to an embodiment, the display unit 220 may include a second housing 221 including a transparent window 222, and a display configured to display external information via the transparent window 222 may be provided inside the second housing 221. The second housing 221 is configured to accommodate various electronic components and the like, and at least a portion of the housing 211 may be made of a conductive material. For example, the second housing 221 may include side walls defining the outer surface of the display unit 220, and the portion exposed to the exterior of the display unit 220 may be made of a conductive metal material. A printed circuit may be accommodated inside the display unit 220. For example, on the printed circuit, a processor (e.g., the processor 120 of FIG. 1), a communication module (e.g., the communication module 190 in FIG. 1), various interfaces (e.g., the interface 177 in FIG. 1), a power management module (e.g., the power management module 188 in FIG. 1), or the like may be mounted in the form of an integrated circuit chip. As another example, a control circuit (not illustrated) may also be configured as an integrated circuit chip and may be mounted on the printed circuit. For example, the control circuit may be a part of the above-described processor or communication module. As another example, a camera and sensors, such as an illuminance sensor or a proximity sensor, may be included in the upper end region of the surface of the second housing 221.

A connector module 300 may be disposed on the top surface 212 of the main body 210 oriented in the first (+Z) direction to be electrically connected to the display unit 220. The connector module 300 may be disposed along a longitudinal direction (+X, −X) of the main body 210. At least a portion (e.g., a cable) of the connector module 300 disposed on the main body 210 is coupled to one end of the display unit 220, and the main body 210 and the display unit 220 may be electrically connected to each other.

The first housing 211 and/or the second housing 221 may include a metal material as a cover surrounding the outer surface of the electronic device 101. According to an embodiment, at least one region of the first housing 211 and/or the second housing 221 may include a plate 310 including or comprising a magnesium (Mg) material, a coating layer 320 formed on at least one region of the plate 310, and a painted layer 330 disposed on one surface of the coating layer 320. The painted layer 330 can be formed by electrodeposition painting or high temperature baking paint.

The plate 310 may use a general magnesium (Mg) series or magnesium-lithium (Mg—Li) alloy. For example, as the general magnesium series, at least one of AZ31B, AZ91, and AZ91D may be used.

In certain embodiments, the plate 310 can comprise magnesium. In other embodiments, the plate 310 can be made of or consist essentially of magnesium or any of Mg—Li alloy, AZ31B, AZ91, and AZ91D.

In the coating layer 320, a zirconium-based coating agent for anti-oxidation may be used. Through a process of transparentizing the coating layer 320, the coating layer can provide an external metallic texture to the magnesium. The painted layer 330 may be formed through anionic electrodeposition painting using a material including an acrylic resin and an organic pigment.

Figure 3:
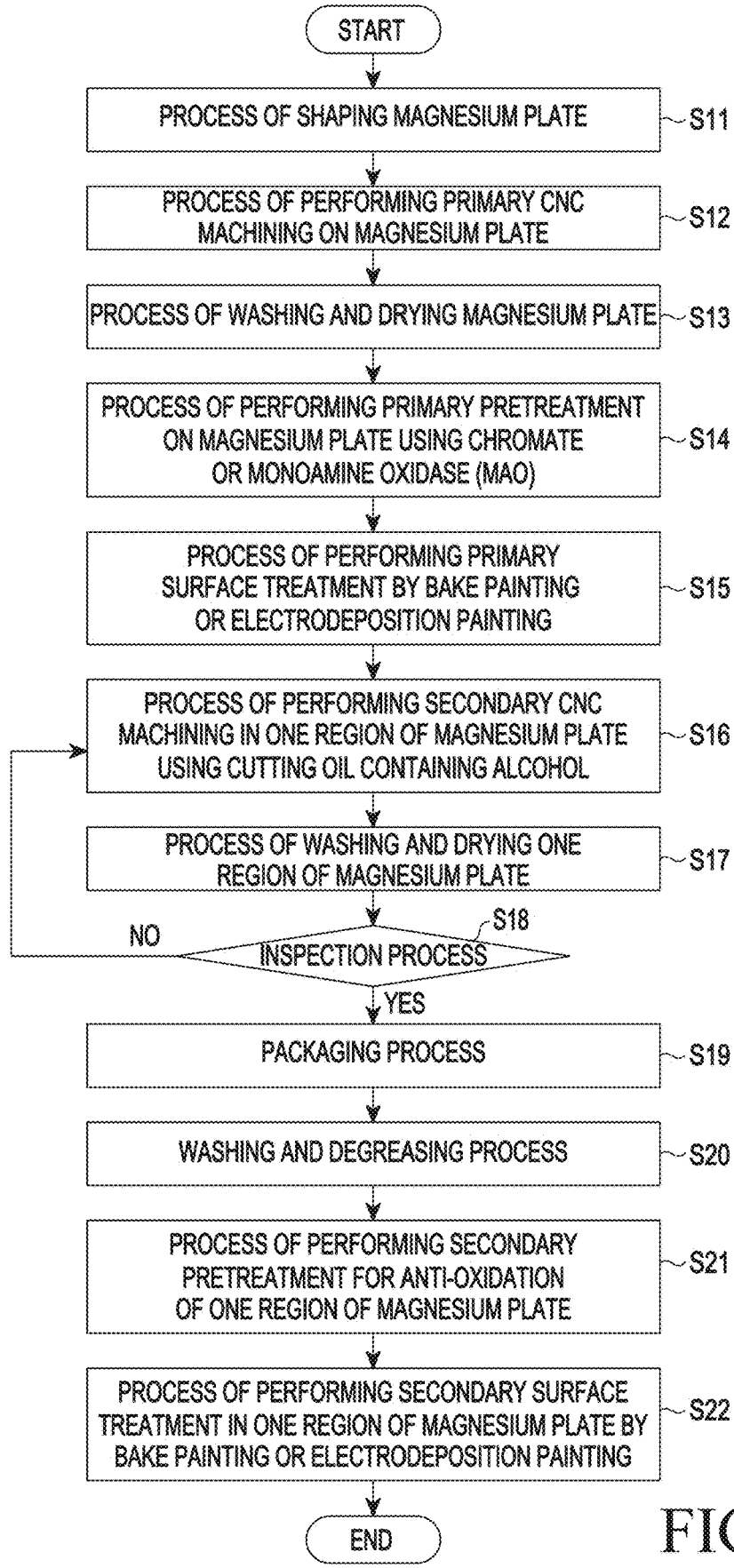
FIG. 3 is a flowchart of a process of manufacturing a cover member of an electronic device according to embodiments of the disclosure.

FIG. 3 is a flowchart of a process of manufacturing a cover member of an electronic device according to embodiments of the disclosure.

An electronic device may include a cover member. The cover member may be made of an alloy containing magnesium as a main material, and may provide an aesthetically pleasing outward metallic texture. The cover member including the magnesium material may have a relatively low specific gravity compared to aluminum, thereby providing a lightweight electronic device that is easy to carry.

The cover member may include a plate region that provides most of the surface of the electronic device, and a machined region in which a predetermined shape (e.g., a predetermined pattern or design) is implemented in at least one region and providing a metallic texture.

Hereinafter, the processes of manufacturing the plate region and the machined region will be sequentially described.

During process 11 (S11), a basic structure of a magnesium plate for a cover member of an electronic device may be shaped. The magnesium plate may be provided through casting molding, press molding, or CNC molding. According to an embodiment, in the magnesium plate, a general magnesium (Mg) series or a magnesium-lithium (Mg—Li) alloy may be used. For example, as the general magnesium series, at least one of AZ31B, AZ91, and AZ91D may be used.

Thereafter, during (S12), the magnesium plate may be subjected to primary CNC machining. In the primary CNC machining, oil-soluble cutting oil or water-soluble cutting oil may be used, and the shape of the magnesium plate may be made to correspond to the specific shape of the cover member of the electronic device.

Thereafter, during (S13), washing and drying processes may be performed on the magnesium plate on which the primary CNC machining has been completed. For example, the washing process may be performed through ultrasonic washing. As another example, the drying process may be performed at about 80 to 150 degrees C. for 10 min or more.

Thereafter, during (S14), a primary pretreatment process may be performed. The primary pretreatment process may be performed by performing an opaque oxidation treatment on the dried magnesium plate using chromate or monoamine oxidase (MAO).

Thereafter, during (S15), a primary surface treatment process may be performed. The primary surface treatment process may be performed through high temperature baking paint or electrodeposition painting. For example, for the high temperature baking paint, a painting method through spraying may be used, and a material including, comprising, consisting essentially of, or comprised of an aluminum paste or titanium dioxide ($TiO_2$) inorganic pigment may be used as the painting material.

Through (S11) to (S15), the entire cover member of the electronic device including magnesium may be machined (e.g., primary machining). Through the primary machining, the electronic device may be light compared to a cover member made of aluminum, and may provide high durability and chemical resistance through pretreatment and surface treatment. Thereafter, through secondary machining, a predetermined shape (e.g., a pattern) may be provided to at least a partial region (e.g., a machined region) of the magnesium plate.

According during (S16), secondary CNC machining may be performed on at least one region (e.g., a machined region) in which a metallic texture or a predetermined shape is to be expressed. The secondary CNC machining may be implemented using a cutting oil containing alcohol and CNC machining for diamond cutting or pattern formation. For example, as the cutting oil, a material containing an oil-soluble cutting oil and alcohol or a material containing a water-soluble cutting oil and alcohol may be used, wherein the alcohol may be contained in an amount of at least 98% by weight based on the total weight of the cutting oil. As another example, a CNC machining tool, a PCD or an MCD may be used, and the machining time may be about 1 min to 2 min. Through the CNC machining, various patterns may be formed in at least one region (e.g., a machined region) of the magnesium plate to provide a three-dimensional effect, and through a high-gloss machining process, a sense of beauty may be provided.

Thereafter, during (S17), washing and drying processes may be performed in the one region in which the secondary CNC machining is completed. According to an embodiment, the washing process is dipping washing using a washing solution containing alcohol, and after (S16), the washing process may be performed immediately. For example, the alcohol may be contained in an amount of at least 98% by weight based on the total weight of the washing solution. Washing equipment may be disposed next to secondary CNC machining equipment, and the washing process may be performed immediately after the second CNC machining is performed.

According to an embodiment, the drying process is performed to remove the alcohol remaining in the high-gloss machined region, and may be performed through a plurality of processes. For example, after performing primary drying by air blow, secondary drying may be performed by massaging the surface using a dry fabric. As the dry fabric, a clean and fine cloth (e.g., winceyette) may be used. Even after the secondary drying, hot air drying may be optionally added to completely remove the alcohol. For example, the hot air drying may be performed at about 100 to 250 degrees C. for about 1 min to 3 min. In general, when the drying process is performed over a long period of time, staining may occur. Therefore, a plurality of drying processes may be performed within a short time. In order to quickly and efficiently remove the alcohol remaining in the machined region of the metal plate, equipment, temperature, and/or time used in the drying process may be variously adjusted, in addition to those in the above-described embodiments.

Thereafter, during (S18), the machined region of the metal plate may be inspected. The inspection may be performed before the metal plate is moved and an additional process is performed thereon, and may be performed by checking the presence or absence of stains on the high-gloss surface of the machined region and/or checking the machined state. For example, the appearance of the machined region is checked, and when the state is poor, the process may return to process 16 (S16) and the process may be performed again. As another example, a manually applied polish may be used to remove surface defects in the machined region, and an IPA washing process may be performed using a clean cloth (e.g., winceyette).

Thereafter, during (S19), a packaging process for moving the metal plate may be performed. When performing the packaging process, vacuum packaging may be performed to prevent oxidation due to moisture in the air. By setting the inspection according to process 16 (S16) and the packaging according to process 17 (S17) to be performed in about 5 min or less, the time for which the metal plate after the washing and drying processes is exposed to air can be minimized.

The secondary machining for machining at least a portion of the magnesium plate may be performed through process 16 (S16) to process 19 (S19). Through the secondary machining, it is possible to provide a sense of beauty of the electronic device. Thereafter, through tertiary machining, a surface providing a metallic texture may be expressed in the region machined through by the secondary machining.

According to process 20 (S20), the vacuum packaging may be removed, and washing and degreasing processes may be performed on the machined region of the magnesium plate. As processes for cleaning the surface before anti-oxidation coating, the washing process proceeds with dewatering and dipping washing, and in the degreasing process, impurities (e.g., oil) on the surface of the machined region may be processed using an alkali-based degreasing agent.

Thereafter, according to process 21 (S21), a secondary pretreatment process may be performed. The secondary pretreatment process may be an anti-oxidation coating process. In the process of forming a coating on the machined region for preventing oxidation, a zirconium-based film agent may be used as a film agent. The zirconium-based film formed in the machined region corresponds to a transparentizing process so the metallic texture of the magnesium plate can be expressed outward as it is, and a design through a predetermined shape (e.g., a pattern) formed in the machined region may be implemented along with the metallic texture.

Thereafter, according to process 22 (S22), a secondary surface treatment process may be performed. The secondary surface treatment process may be performed through high temperature baking paint or electrodeposition painting. For example, anionic electrodeposition painting may be performed, and a material containing an acrylic resin and an organic pigment may be used.

Thereafter, according to process 23 (S23), a drying process may be performed. The drying process is performed at about 130 to 200 degrees C., and when the drying process is completed, a magnesium plate including a machined region having a metallic texture can be completed.

According to certain embodiments of the disclosure, by manufacturing the cover member using a material including magnesium (Mg), it is possible to make the electronic device easy to carry, to provide various shapes such as patterns in some regions, and to express a metallic texture to provide a sense of design aesthetics.

Figure 4:
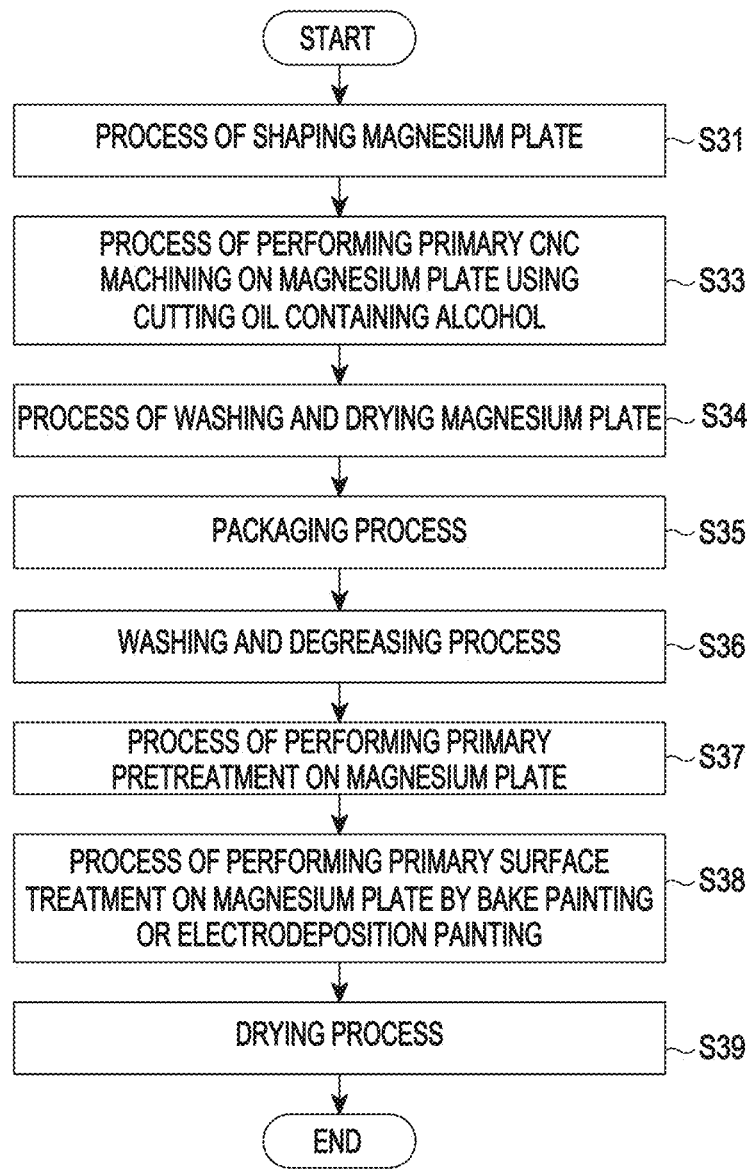
FIG. 4 is a flowchart of a process of manufacturing a cover member of an electronic device according to other embodiments of the disclosure.

FIG. 4 is a flowchart of a process of manufacturing a cover member of an electronic device according to other embodiments of the disclosure.

According to certain embodiments, an electronic device may include a cover member. The cover member may be made of an alloy containing magnesium as a main material, and may provide a sense of beauty through a metallic texture expressed outward. Since the cover member containing the magnesium material is configured to have a relatively low specific gravity compared to aluminum, it is possible to provide a lightweight electronic device that is easy to carry.

According to certain embodiments, the cover member may include a metal plate providing the entire region of the surface of the electronic device. The entire region of the metal plate may provide a metallic texture to represent a beautiful design.

Hereinafter, a process of manufacturing a metal plate will be sequentially described.

According to certain embodiments, according to process 31 (S31), a basic structure of a magnesium plate for a cover member of an electronic device may be shaped. The magnesium plate may be provided through casting molding, press molding, or CNC molding. According to an embodiment, in the magnesium plate, a general magnesium (Mg) series or a magnesium-lithium (Mg—Li) alloy may be used. For example, as the general magnesium series, at least one of AZ31B, AZ91, and AZ91D may be used.

Thereafter, according to process 32 (S32), a predetermined pattern may be shaped in one region of the surface of the magnesium plate. For example, the predetermined pattern may be implemented in various shapes including a hairline structure and/or a sandblast structure through a predetermined method.

Thereafter, according to process 33 (S33), primary CNC machining may be performed on the entire region of the magnesium plate to exhibit a metallic texture. In the primary CNC machining, a cutting oil containing alcohol may be used. For example, as the cutting oil, a material containing an oil-soluble cutting oil and alcohol or a material containing a water-soluble cutting oil and alcohol may be used, wherein the alcohol may be contained in an amount of at least 98% by weight based on the total weight of the cutting oil.

Thereafter, according to process 34 (S34), washing and drying processes may be performed on the magnesium plate on which the primary CNC machining is completed. According to an embodiment, the drying process is performed to remove the alcohol remaining on the metal plate, and may be performed through a plurality of processes. For example, after performing primary drying through air blow, secondary drying may be performed by massaging the surface using a dry fabric. As the dry fabric, a clean and fine cloth (e.g., winceyette) may be used. Even after the secondary drying, hot air drying may be optionally added to completely remove the alcohol. For example, the hot air drying may be performed at about 100 to 250 degrees C. for about 1 min to 3 min.

Thereafter, according to process 35 (S35), the magnesium plate may be inspected, and a packaging process for movement may be performed. When performing the packaging process, a vacuum packaging process may be performed to prevent oxidation due to moisture in the air. In addition, it is possible to prevent oxidation of the magnesium plate by setting the inspection and the packaging to be performed in about 5 min or less.

Thereafter, the magnesium plate, a processing location of which has been moved, may be subjected to a process for expressing a surface that provides a metallic texture to the entire region.

According to process 36 (S36), the vacuum packaging may be removed, and washing and degreasing processes may be performed on the magnesium plate. As processes for cleaning the surface before anti-oxidation coating, the washing process proceeds with dewatering and dipping washing, and in the degreasing process, impurities (e.g., oil) on the surface may be processed using an alkali-based degreasing agent.

Thereafter, according to process 37 (S37), a primary pretreatment process may be performed. The primary pretreatment process may be an anti-oxidation coating process. In the process of forming a coating on the machined region for anti-oxidation, a zirconium-based film agent may be used as a film agent. The zirconium-based film formed in the machined region corresponds to a transparentizing process so the metallic texture of the magnesium plate can be expressed outward as it is, and a design through a predetermined shape (e.g., a pattern) formed in the machined region may be implemented along with the metallic texture.

Thereafter, according to process 38 (S38), a primary surface treatment process may be performed. The primary surface treatment process may be performed through high temperature baking paint or electrodeposition painting. For example, anionic electrodeposition painting may be performed, and a material containing an acrylic resin and an organic pigment may be used.

Thereafter, according to process 39 (S39), a drying process may be performed. The drying process is performed at about 130 to 200 degrees C., and when the drying process is completed, a magnesium plate having a metallic texture in the entire region thereof can be completed.

Figure 5:
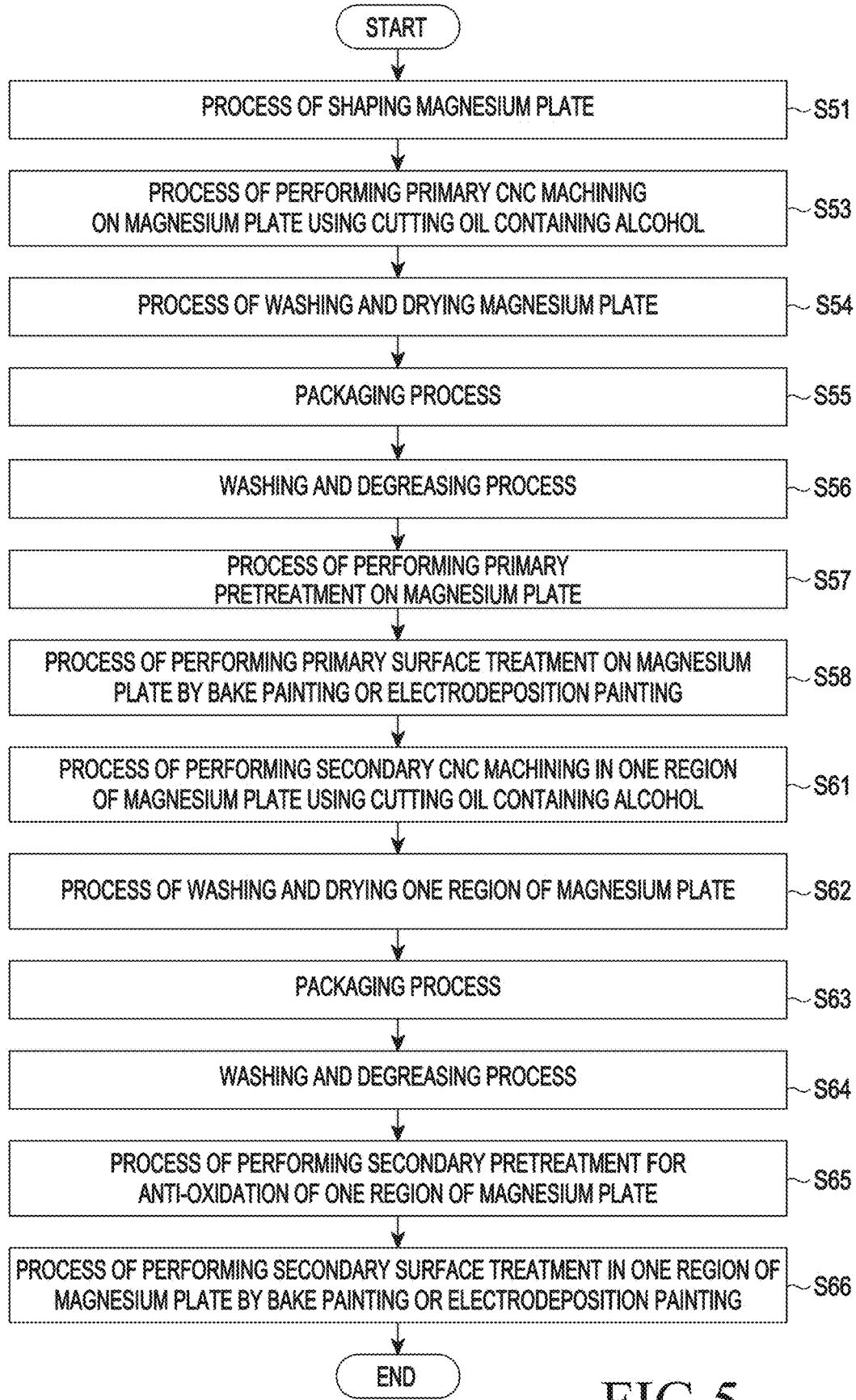
FIG. 5 is a flowchart of a process of manufacturing a cover member of an electronic device according to still other embodiments of the disclosure.

FIG. 5 is a flowchart of a process of manufacturing a cover member of an electronic device according to still other embodiments of the disclosure.

According to certain embodiments, an electronic device may include a cover member. The cover member may be made of an alloy containing magnesium as a main material, and may provide a sense of beauty through a metallic texture expressed outward. The cover member including the magnesium material may be configured to have a relatively low specific gravity compared to aluminum, thereby providing a lightweight electronic device that is easy to carry.

According to certain embodiments, the cover member may include a plate region that provides most of the surface of the electronic device, and a machined region in which a predetermined shape (e.g., a predetermined pattern or design) is implemented in at least one region and which provides a metallic texture. The plate region and the machined region may provide a metallic texture to represent a beautiful design.

Hereinafter, the processes of manufacturing the plate region and the machined region will be sequentially described.

According to certain embodiments, according to process 51 (S51), a basic structure of a magnesium plate for a cover member of an electronic device may be shaped. The magnesium plate may be provided through casting molding, press molding, or CNC molding. For example, a sheet-shaped magnesium may be provided through press molding. According to an embodiment, in the magnesium plate, a general magnesium (Mg) series or a magnesium-lithium (Mg—Li) alloy may be used. For example, as the general magnesium series, at least one of AZ31B, AZ91, and AZ91D may be used.

Thereafter, according to process 52 (S52), a predetermined pattern may be shaped in one region of the surface of the magnesium plate. For example, the predetermined pattern may be implemented in various shapes including a hair line structure and/or a sand blast structure through a predetermined method.

Thereafter, according to process 53 (S53), CNC machining may be performed on the entire region of the magnesium plate to exhibit a metallic texture. In the CNC machining, a cutting oil containing alcohol may be used. For example, as the cutting oil, a material containing an oil-soluble cutting oil and alcohol or a material containing a water-soluble cutting oil and alcohol may be used, wherein the alcohol may be contained in an amount of at least 98% by weight based on the total weight of the cutting oil.

Thereafter, according to process 54 (S54), washing and drying processes may be performed on the magnesium plate on which the CNC machining is completed. According to an embodiment, the drying process is performed to remove the alcohol remaining on the metal plate, and may be performed through a plurality of processes. For example, after performing primary drying by air blow, secondary drying may be performed by massaging the surface using a dry fabric. As the dry fabric, a clean and fine cloth (e.g., winceyette) may be used. Even after the secondary drying, hot air drying may be optionally added to completely remove the alcohol. For example, the hot air drying may be performed at about 100 to 250 degrees C. for about 1 min to 3 min.

Thereafter, according to process 55 (S55), the magnesium plate may be inspected, and a packaging process for moving the magnesium plate may be performed. When performing the packaging process, a vacuum packaging process may be performed to prevent oxidation due to moisture in the air. In addition, it is possible to prevent oxidation of the magnesium plate by setting the inspection and the packaging to be performed in about 5 min or less.

Thereafter, the magnesium plate, a processing location of which has been moved, may be subjected to a process for expressing a surface that provides a metallic texture to the entire region.

According to process 56 (S56), the vacuum packaging may be removed, and washing and degreasing processes may be performed on the magnesium plate. As processes for cleaning the surface before anti-oxidation coating, the washing process proceeds with dewatering and dipping washing, and in the degreasing process, impurities (e.g., oil) on the surface may be processed using an alkali-based degreasing agent.

Thereafter, according to process 57 (S57), a primary pretreatment process may be performed. The primary pretreatment process may be an anti-oxidation coating process. In the process of forming a coating on the machined region for anti-oxidation, a zirconium-based film agent may be used as a film agent. The zirconium-based film formed in the machined region corresponds to a transparentizing process so the metallic texture of the magnesium plate can be expressed outward as it is, and a design through a predetermined shape (e.g., a pattern) formed in the machined region may be implemented along with the metallic texture.

Thereafter, according to process 58 (S58), a primary surface treatment process may be performed. The primary surface treatment process may be performed through high temperature baking paint or electrodeposition painting. For example, anionic electrodeposition painting may be performed, and a material containing an acrylic resin and an organic pigment may be used.

Thereafter, an additional process for providing a metallic texture and a predetermined shape may be performed on at least a partial region (e.g., a machined region) of the magnesium plate.

According to process 61, secondary CNC machining may be performed on at least a partial region (e.g., a machined region) in which a metallic texture and a predetermined shape are to be expressed. The secondary CNC machining may be implemented using a cutting oil containing alcohol and CNC machining for diamond cutting or pattern formation. For example, as the cutting oil, a material containing an oil-soluble cutting oil and alcohol or a material containing a water-soluble cutting oil and alcohol may be used, wherein the alcohol may be contained in an amount of at least 98% by weight based on the total weight of the cutting oil. As another example, a CNC machining tool, a PCD or an MCD may be used, and the machining time may be about 1 min to 2 min. Through the CNC machining, various patterns may be formed in at least one region (e.g., a machined region) of the magnesium plate to provide a three-dimensional effect, and through a high-gloss machining process, a sense of beauty may be provided.

Thereafter, according to process 62 (S61), washing and drying processes may be performed in the one region in which the secondary CNC machining is completed. According to an embodiment, the washing process is dipping washing using a washing solution containing alcohol, and after process 61 (S61), the washing process may be performed immediately.

According to an embodiment, the drying process is performed to remove the alcohol remaining in the high-gloss machined region, and may be performed through a plurality of processes. For example, after performing primary drying by air blow, secondary drying may be performed by massaging the surface using a dry fabric. As the dry fabric, a clean and fine cloth (e.g., winceyette) may be used. Even after the secondary drying, hot air drying may be optionally added to completely remove the alcohol. For example, the hot air drying may be performed at about 100 to 250 degrees C. for about 1 min to 3 min.

Thereafter, according to process 63 (S63), the machined region may be inspected, and a packaging process for movement may be performed. When performing the packaging process, a vacuum packaging process may be performed to prevent oxidation due to moisture in the air. In addition, it is possible to prevent oxidation of the machined region by setting the inspection and the packaging to be performed in about 5 min or less.

Thereafter, according to process 64 (S64), the vacuum packaging may be removed, and washing and degreasing processes may be performed on the machined region of the magnesium plate. As processes for cleaning the surface before anti-oxidation coating, the washing process proceeds with dewatering and dipping washing, and in the degreasing process, impurities (e.g., oil) on the surface of the machined region may be processed using an alkali-based degreasing agent.

Thereafter, according to process 65 (S65), a secondary pretreatment process may be performed. The secondary pretreatment process may be an anti-oxidation coating process. In the process of forming a coating on the machined region for anti-oxidation, a zirconium-based film agent may be used as a film agent. The zirconium-based film formed in the machined region corresponds to a transparentizing process so the metallic texture of the magnesium plate can be expressed outward as it is, and a design through a predetermined shape (e.g., a pattern) formed in the machined region may be implemented along with the metallic texture.

Thereafter, according to process 66 (S66), a secondary surface treatment process may be performed. The secondary surface treatment process may be performed through high temperature baking paint or electrodeposition painting. For example, anionic electrodeposition painting may be performed, and a material containing an acrylic resin and an organic pigment may be used.

Thereafter, according to process 67 (S67), through a drying process performed at about 130 to 200 degrees C., a magnesium plate including a machined region having a metallic texture can be completed.

Figure 6A:
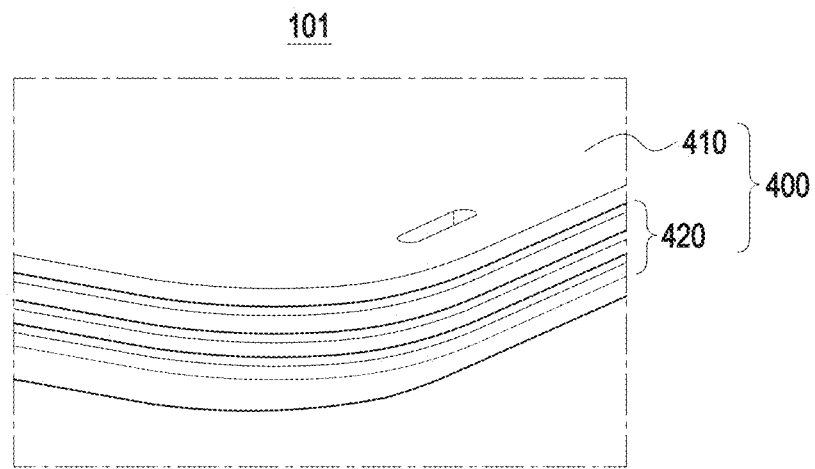
FIG. 6A is a perspective view illustrating a shape obtained by machining at least a portion of an electronic device according to certain embodiments of the disclosure.
Figure 6B:
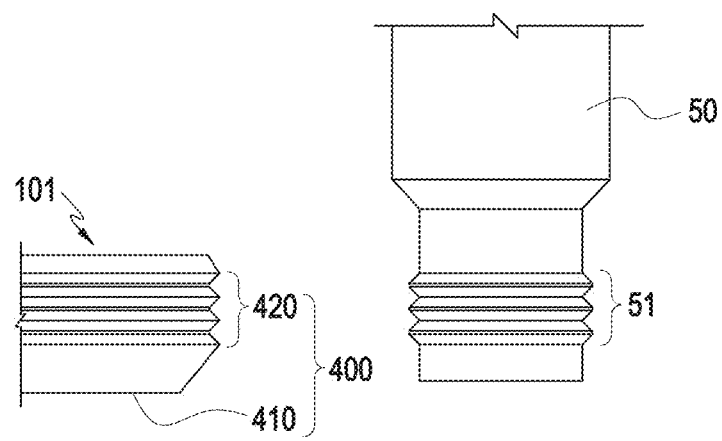
FIG. 6B illustrates a cross-sectional view of the electronic device of FIG. 6A and a view illustrating a machining tool.

FIG. 6A is a perspective view illustrating a shape obtained by machining at least a portion of an electronic device according to certain embodiments of the disclosure. FIG. 6B illustrates a cross-sectional view of the electronic device of FIG. 6A and a view illustrating a machining tool.

The electronic device 101 may include a cover member 400. The cover member 400 may be made of an alloy containing magnesium (Mg) as a main material, and may provide aesthetics through a metallic texture expressed outward.

The cover member 400 may include a first region 410 that provides most of the surface of the electronic device 101, and a second region 420 in which a predetermined shape (e.g., a predetermined pattern or design) is implemented in at least one region and which provides a metallic texture. For example, the first region 410 of the cover member 400 may cover the front surface and/or the rear surface of the electronic device 101, and the second region 420 of the cover member 400 may cover a portion of the side surface of the electronic device 101.

Referring to FIGS. 6A and 6B, the structure of the second region 420 of the cover member 400 may be the same in whole or in part as the structure of the machined region in FIGS. 3 and 5. According to an embodiment, the second region 420 may be formed through CNC machining using a cutting oil containing alcohol, a pretreatment process of forming a coating layer using a zirconium-based film agent, a surface treatment process according to high temperature baking paint or electrodeposition painting, and the like. The second region 420 may provide the predetermined shape and express a metallic texture to provide a sense of design aesthetics. In certain embodiments, the first region 410 can be a first surface, and the second region 420 can generally be a second surface that is substantially orthogonal the first surface.

The shape of the second region 420 may include a side surface and an edge portion of the electronic device 101. The second region 420 may be implemented through the secondary CNC machining according to process 16 (S16) in FIG. 3 or the secondary CNC machining according to process 58 (S58) in FIG. 5. For example, the secondary CNC machining may be implemented using a cutting oil containing alcohol and CNC machining for diamond cutting or pattern formation. For example, as the cutting oil, a material containing an oil-soluble cutting oil and alcohol or a material containing a water-soluble cutting oil and alcohol may be used, wherein the alcohol may be contained in an amount of at least 98% by weight based on the total weight of the cutting oil. As another example, a CNC machining tool, a PCD or an MCD may be used, and the machining time may be about 1 min to 2 min. Through the CNC machining, various patterns may be formed in the second region 420 of the magnesium plate to provide a three-dimensional effect, and through a high-gloss machining process, a sense of beauty may be provided.

A special-shaped tool 50 may be used to implement the shape of the second region 420. For example, as illustrated in FIG. 6B, the special-shaped tool 50 may be provided with a structure 51 in which horizontal line shapes are arranged side by side to machine a side surface and an edge portion of an electronic device 101 into a shape corresponding to that of the tool while rotating along the side surface and/or the edge portion of the cover member 400.

Thereafter, the process may proceed according to the process of each flowchart of FIG. 3 or FIG. 5.

Figure 7A:
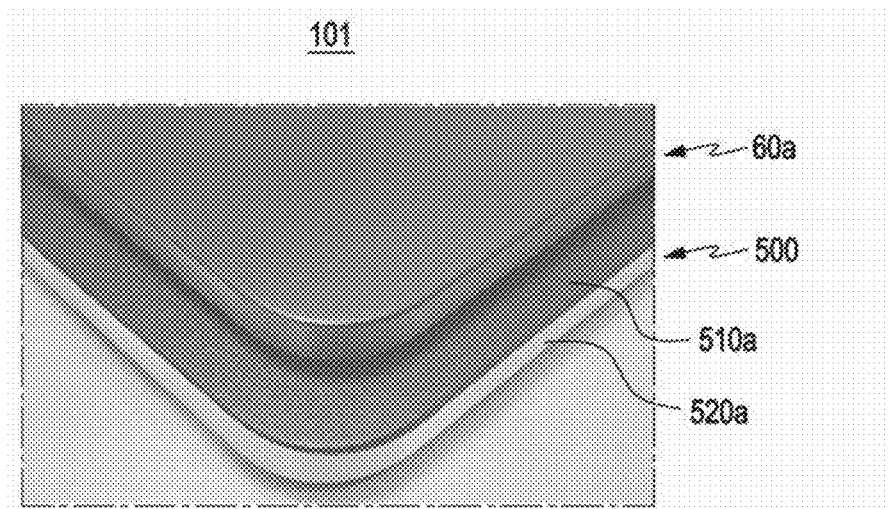
FIGS. 7A and 7B are views illustrating an outer surface of an electronic device manufactured according to certain embodiments of the disclosure and an outer surface of a general electronic device in comparison.
Figure 7B:
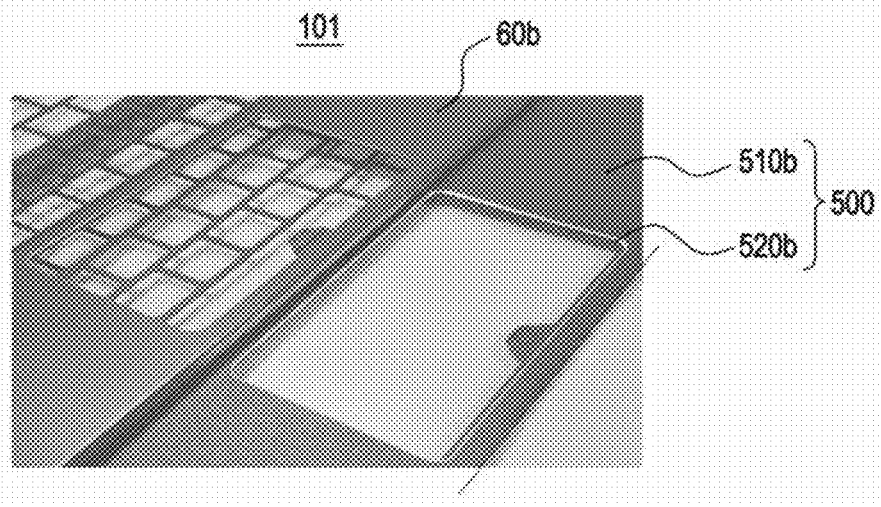
Figure 8:
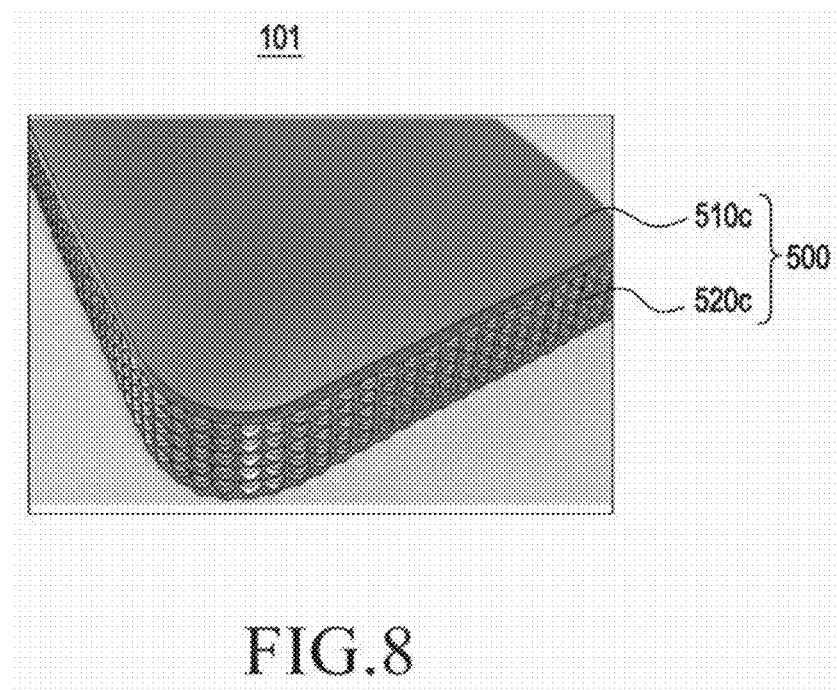
FIG. 8 is a perspective view illustrating an outer surface of an electronic device manufactured according to certain embodiments of the disclosure.

FIGS. 7A and 7B are views illustrating an outer surface of an electronic device manufactured according to certain embodiments of the disclosure and an outer surface of a general electronic device in comparison. FIG. 8 is a perspective view illustrating an outer surface of an electronic device manufactured according to certain embodiments of the disclosure.

The electronic device 101 may include a cover member 500. The cover member 500 may be made of an alloy containing magnesium (Mg) as a main material, and may provide a sense of beauty through a metallic texture expressed outward.

The cover member 500 may include a first region 510*a*, 510*b*, or 510*c* that provides most of the surface of the electronic device 101, and a second region 520*a*, 520, or 520*c* in which a predetermined shape (e.g., a predetermined pattern or design) is implemented in at least one region and which provides a metallic texture. For example, the first region 510*a*, 510*b*, or 510*c* of the cover member 500 may cover the front surface and/or the rear surface of the electronic device 101, and the second region 520*a*, 520*b*, or 520*c* of the cover member 500 may cover a portion of the side surface of the electronic device 101. It is noted that a number of electronic devices such as smartphones are characterized with small in one of the dimensions, such as depth, thereby allowing the smartphone to be easily carried in a pocked. The second region 520 can be a surface along the small or narrow dimension.

Referring to FIGS. 7A and 7B, the structure of the cover member 500 may be the same in whole or in part as the structure of the metal plate in FIGS. 3 and 5. The first region 510*a* or 510*b* and the second region 520*a* or 520*b* of the cover member 500 according to an embodiment may provide an outer surface on which a metal texture is exhibited, compared to a general cover member 60*a* or 60*b*.

According to certain embodiments, in FIGS. 7A and 7B, the second region 520*a* or 520*b* of the cover member 500 may provide a sense of beauty by diamond cutting according to a CNC process. In FIG. 8, the second region 510*c* of the cover member 500 may provide a sense of beauty by CNC machining for pattern formation. As another example, each of the second regions 520*a*, 520*b*, or 520*c* in FIGS. 7A to 8 may provide a sense of beauty by a high-gloss machining process.

A method of manufacturing a cover member of an electronic device according to certain embodiments of the disclosure may include: a process of shaping a plate comprising magnesium (e.g., process 11 (S11) in FIG. 3), a process of performing primary Computer Numerical Control (CNC) machining on the magnesium plate using a predetermined cutting oil (e.g., process 12 (S12) in FIG. 3), a process of performing a primary pretreatment on the magnesium plate using chromate or micro arc oxidation (MAO) (e.g., process 14 (S14) in FIG. 3), a process of performing a primary surface treatment by high temperature baking paint or electrodeposition painting on the magnesium plate (e.g., process 15 (S15) in FIG. 3), a process of performing secondary CNC machining on one region of the magnesium plate using a cutting oil containing alcohol (e.g., process 16 (S16) in FIG. 3), a process of performing washing and drying (e.g., process 17 (S17) in FIG. 3) the magnesium plate, a process of performing a secondary pretreatment to prevent oxidation in the one region (e.g., process 21 (S21)

in FIG. 3), and a process of performing a secondary surface treatment by high temperature baking paint or electrodeposition painting in the one region (e.g., process 22 (S22) in FIG. 3).

According to certain embodiments, wherein during the secondary CNC machining process, the alcohol in the cutting oil is in an amount of at least 98% by weight based on a total weight of the cutting oil, and a gloss may be provided through the secondary CNC machining the process.

According to certain embodiments, during the secondary pretreatment process, an anti-oxidation coating process may be performed using a zirconium-based coating agent in the one region, and in the anti-oxidation coating process, a transparent coating layer may be formed to provide outward a metallic texture of the magnesium plate.

According to certain embodiments, in the secondary surface treatment process, anion electrodeposition painting using a material including an acrylic resin and an organic pigment may be performed.

According to certain embodiments, wherein the washing and drying process may include: a process of washing the metal plate using a washing solution containing alcohol, primary drying of removing the alcohol by air blow, and secondary drying by massaging the surface of the metal plate using a dry fabric.

According to certain embodiments, after the secondary drying, hot air drying may be additionally performed at 100 to 250 degrees C. for 1 min to 3 min.

According to certain embodiments, the primary CNC machining process may be performed using a water-soluble or oil-soluble cutting oil.

According to certain embodiments, a process of drying the magnesium plate through ultrasonic cleaning is further included before the primary pretreatment process, wherein, in the primary pretreatment process, an opaque oxidation treatment may be performed on the dried magnesium plate using the chromate or the micro arc oxidation (MAO).

According to certain embodiments, in the primary surface treatment process, the high temperature baking paint may be performed through spraying using a material containing an aluminum paste or a titanium dioxide ($TiO_2$) inorganic pigment.

According to certain embodiments, a process of packaging for moving may be further included after the process of drying and washing, wherein the packaging process may be performed in a vacuum packaging method in order to prevent oxidation by moisture in air.

According to certain embodiments, a process of hot air drying at 130 to 200 degrees C. may be further included after the secondary surface treatment process.

According to certain embodiments, a process of performing inspection for checking a machined state of an exterior of the one region of the magnesium plate may be further included after the process of washing and drying.

A method of manufacturing a cover member of an electronic device according to certain embodiments of the disclosure may include: a process of shaping a plate comprising magnesium (e.g., process 31 (S31) in FIG. 4 or process 51 (S51) in FIG. 5), a process of performing primary CNC machining on the magnesium plate using a cutting oil containing alcohol (e.g., process 33 (S33) in FIG. 4 or process 53 (S53) in FIG. 5), a process of washing and drying (e.g., process 34 (S34) in FIG. 4 or process 54 (S54) in FIG. 5), a process of performing a primary pretreatment for preventing oxidation on the magnesium plate (e.g., process 37 (S37) in FIG. 4 or process 57 (S57) in FIG. 5), and a process of performing a primary surface treatment by high temperature baking paint or electrodeposition painting on the magnesium plate (e.g., process 38 (S38) in FIG. 4 or in process 58 (S58) in FIG. 5).

According to certain embodiments, the method may further include: after the secondary surface treatment process, a process of performing secondary CNC machining on one region of the magnesium plate using a cutting oil containing alcohol (e.g., process 61 (S61) in FIG. 5), a process of washing and drying (e.g., process 62 (S62) in FIG. 5), a process of performing a secondary pretreatment to prevent oxidation in the one region (e.g., process 65 (S65) in FIG. 5), and a process of performing a secondary surface treatment by high temperature baking paint or electrodeposition painting in the one region (e.g., process 66 (S66) in FIG. 5).

According to certain embodiments, a process of hot air drying at 130 to 200 degrees C. may be further included after the primary surface treatment process.

According to certain embodiments, in the primary pretreatment process and the secondary pretreatment process, an anti-oxidation coating process may be performed using a zirconium-based coating agent in the one region, and in the anti-oxidation coating process, a transparent coating layer may be formed to provide outward a metallic texture of the magnesium.

According to certain embodiments, in the primary CNC machining process and the secondary CNC machining process, the alcohol may be contained in the cutting oil in an amount of at least 98% by weight based on a total weight of the cutting oil, and a gloss may be provided through the machining processes.

According to certain embodiments, a process of packaging for moving may be further included after the process of drying and washing, wherein the packaging process may be performed in a vacuum packaging method in order to prevent oxidation by moisture in air.

A cover member of an electronic device according to certain embodiments of the disclosure may include: a plate comprising magnesium (e.g., the plate 310 in FIG. 2), a zirconium-based transparent coating layer (e.g., the coating layer 320 in FIG. 2) formed on at least one region of the plate, and a painted layer (e.g., the painted layer 330 in FIG. 2) disposed on one surface of the coating layer and formed by anionic electrodeposition painting using a material including an acrylic resin and an organic pigment.

According to certain embodiments, the coating layer formed in the one region may form a transparent coating layer and may provide an outward metallic texture to the magnesium plate.

As will be apparent to a person ordinarily skilled in the technical field to which the disclosure belongs, a cover member manufacturing method and a cover member structure according to certain embodiments of the disclosure are not limited by the above-described embodiments and drawings, and may be variously substituted, modified, and changed within the technical scope of the disclosure.

What is claimed is:

1. A method of manufacturing a cover member of an electronic device, the method comprising:
    shaping a plate comprising magnesium;
    performing primary computer numerical control (CNC) machining on the magnesium plate using a predetermined cutting oil;
    performing a primary pretreatment on the magnesium plate using a chromate or micro arc oxidation (MAO);
    performing a primary surface treatment on the magnesium plate by high temperature baking paint or electrodeposition painting;

performing secondary CNC machining on one region of the magnesium plate using a cutting oil containing alcohol;

washing and drying the magnesium plate;

performing a secondary pretreatment for preventing oxidation in the one region; and performing a secondary surface treatment by high temperature baking paint or electrodeposition painting in the one region.

2. The method of claim 1, wherein, during the secondary CNC machining, the alcohol in the cutting oil is in an amount of at least 98% by weight based on a total weight of the cutting oil, and a gloss is provided through the secondary CNC machining.

3. The method of claim 1, wherein, during the secondary pretreatment, anti-oxidation coating is performed using a zirconium-based coating agent in the one region, and in the anti-oxidation coating, a transparent coating layer is formed to provide outward a metallic texture of the magnesium plate.

4. The method of claim 3, wherein, in the secondary surface treatment, anionic electrodeposition painting using a material including an acrylic resin and an organic pigment is performed.

5. The method of claim 1, wherein washing and drying the magnesium plate includes:

washing the magnesium plate using a washing solution containing alcohol;

performing primary drying to remove the alcohol by air blow; and performing secondary drying by massaging a surface of the magnesium plate using a dry fabric.

6. The method of claim 5, further comprising hot air drying is additionally performed at 100 to 250 degrees C. for 1 min to 3 min after the secondary drying.

7. The method of claim 1, wherein the primary CNC machining is performed using a water-soluble or oil-soluble cutting oil.

8. The method of claim 1 further comprising:

drying the magnesium plate through ultrasonic cleaning before the primary pretreatment, wherein, in the primary pretreatment, an opaque oxidation treatment is performed on the dried magnesium plate using the chromate or the micro arc oxidation (MAO).

9. The method of claim 1, wherein, in the primary surface treatment, the high temperature baking paint is performed through spraying using a material containing aluminum paste or a titanium dioxide ($TiO_2$) inorganic pigment.

10. The method of claim 1, further comprising:

performing packaging for movement after the drying and washing, wherein the packaging is performed in a vacuum packaging method in order to prevent oxidation by moisture in air.

11. The method of claim 1, further comprising:

performing hot air drying at 130 to 200 degrees C. after the secondary surface treatment.

12. The method of claim 1, further comprising:

performing inspection for checking a machined state of an exterior of the one region of the magnesium plate after the washing and drying.

* * * * *